(12) United States Patent
Nishimura et al.

(10) Patent No.: US 10,128,108 B2
(45) Date of Patent: Nov. 13, 2018

(54) OXIDE SINTERED BODY, SPUTTERING TARGET, AND OXIDE SEMICONDUCTOR THIN FILM OBTAINED USING SPUTTERING TARGET

(71) Applicant: SUMITOMO METAL MINING CO., LTD., Tokyo (JP)

(72) Inventors: Eiichiro Nishimura, Ome (JP); Tokuyuki Nakayama, Ome (JP); Fumihiko Matsumura, Ome (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 7 days.

(21) Appl. No.: 15/520,983

(22) PCT Filed: Nov. 16, 2015

(86) PCT No.: PCT/JP2015/082068
§ 371 (c)(1),
(2) Date: Apr. 21, 2017

(87) PCT Pub. No.: WO2016/084636
PCT Pub. Date: Jun. 2, 2016

(65) Prior Publication Data
US 2017/0345653 A1  Nov. 30, 2017

(30) Foreign Application Priority Data
Nov. 25, 2014 (JP) ................. 2014-237808

(51) Int. Cl.
*H01B 1/08* (2006.01)
*C23C 14/00* (2006.01)
(Continued)

(52) U.S. Cl.
CPC ...... *H01L 21/02565* (2013.01); *C03C 17/245* (2013.01); *C04B 35/01* (2013.01);
(Continued)

(58) Field of Classification Search
CPC .. H01B 1/00; H01B 1/08; C04B 35/00; C04B 35/01; C23C 14/00; C23C 14/08;
(Continued)

(56) References Cited

U.S. PATENT DOCUMENTS 8,329,506 B2 * 12/2012 Akimoto ................. H01L 29/04
438/104
9,209,257 B2 * 12/2015 Utsuno ................... C04B 35/01
(Continued)

FOREIGN PATENT DOCUMENTS

JP  2006-100857 A1  4/2006
JP  2007-073312 A1  3/2007
(Continued)

OTHER PUBLICATIONS

International Search Report for International Application No. PCT/JP2015/082068 dated Jan. 19, 2016.
(Continued)

*Primary Examiner* — Mark Kopec
(74) *Attorney, Agent, or Firm* — Kratz, Quintos & Hanson, LLP

(57) ABSTRACT

Provided are an oxide sintered compact whereby low carrier density and high carrier mobility are obtained when the oxide sintered compact is used to obtain an oxide semiconductor thin film by a sputtering method, and a sputtering target which uses the oxide sintered compact. This oxide sintered compact contains oxides of indium, gallium, and aluminum. The gallium content is from 0.15 to 0.49 by Ga/(In+Ga) atomic ratio, and the aluminum content is from 0.0001 to less than 0.25 by Al/(In+Ga+Al) atomic ratio. A crystalline oxide semiconductor thin film formed using this oxide sintered compact as a sputtering target is obtained at a carrier density of $4.0 \times 10^{18}$ cm$^{-3}$ or less and a carrier mobility of 10 cm$^{-2}$V$^{-1}$sec$^{-1}$ or greater.

4 Claims, 5 Drawing Sheets

(51) Int. Cl.

| | | |
|---|---|---|
| *C04B 35/01* | (2006.01) | |
| *H01L 21/02* | (2006.01) | |
| *C23C 14/08* | (2006.01) | |
| *C23C 14/34* | (2006.01) | |
| *H01J 37/34* | (2006.01) | |
| *H01L 21/465* | (2006.01) | |
| *H01L 29/24* | (2006.01) | |
| *C03C 17/245* | (2006.01) | |
| *C04B 35/626* | (2006.01) | |
| *C23C 14/58* | (2006.01) | |
| *H01L 29/786* | (2006.01) | |

(52) U.S. Cl.
CPC .......... *C04B 35/6261* (2013.01); *C23C 14/08* (2013.01); *C23C 14/3407* (2013.01); *C23C 14/3414* (2013.01); *C23C 14/5806* (2013.01); *H01B 1/08* (2013.01); *H01J 37/3426* (2013.01); *H01L 21/02422* (2013.01); *H01L 21/02592* (2013.01); *H01L 21/02631* (2013.01); *H01L 21/02664* (2013.01); *H01L 21/465* (2013.01); *H01L 29/247* (2013.01); *C03C 2217/23* (2013.01); *C03C 2218/156* (2013.01); *C04B 2235/3217* (2013.01); *C04B 2235/3222* (2013.01); *C04B 2235/3286* (2013.01); *C04B 2235/5445* (2013.01); *C04B 2235/604* (2013.01); *C04B 2235/6562* (2013.01); *C04B 2235/6565* (2013.01); *C04B 2235/6586* (2013.01); *C04B 2235/72* (2013.01); *C04B 2235/76* (2013.01); *C04B 2235/80* (2013.01); *C04B 2235/96* (2013.01); *H01L 29/7869* (2013.01)

(58) Field of Classification Search
CPC ......... C23C 14/34; C23C 14/58; H01L 21/00; H01L 21/203; H01L 21/363
See application file for complete search history.

(56) References Cited

U.S. PATENT DOCUMENTS

| | | |
|---|---|---|
| 2011/0180763 A1 | 7/2011 | Utsuno |
| 2012/0012838 A1 | 1/2012 | Hosono |
| 2013/0140502 A1 | 6/2013 | Tomai |

FOREIGN PATENT DOCUMENTS

| | | |
|---|---|---|
| JP | 2010-219538 A1 | 9/2010 |
| JP | 2012-211065 A1 | 11/2012 |
| JP | 2014-214359 A1 | 11/2014 |
| TW | 201439027 A | 10/2014 |
| WO | 2010/032422 A1 | 3/2010 |
| WO | 2011/152048 A1 | 12/2011 |
| WO | 2014/112376 A1 | 7/2014 |

OTHER PUBLICATIONS

Office Action issued to TW Application No. 104137984, dated Aug. 25, 2016 (6 Sheets), (No English language translation provided).

* cited by examiner

ELECTRON BEAM DIFFRACTION PHOTOGRAPH
OF WHITE CRYSTAL GRAINS

ELECTRON BEAM DIFFRACTION PHOTOGRAPH
OF BLACK CRYSTAL GRAINS

OXIDE SINTERED BODY, SPUTTERING TARGET, AND OXIDE SEMICONDUCTOR THIN FILM OBTAINED USING SPUTTERING TARGET

TECHNICAL FIELD

The present invention relates to an oxide sintered body, a target, and an oxide semiconductor thin film obtained by using the target, and more particularly to a sputtering target that allows an amorphous oxide semiconductor thin film to have low carrier density by allowing the amorphous oxide semiconductor thin film to contain indium, gallium, and aluminum, an oxide sintered body that is most suitable for obtaining the sputtering target and contains indium, gallium, and aluminum, and an amorphous oxide semiconductor thin film that is obtained by using the sputtering target, has low carrier density and high carrier mobility, and contains indium, gallium, and aluminum.

BACKGROUND ART

Thin film transistors (TFTs) are a type of field effect transistors (hereinafter referred to as FETs). TFTs are three-terminal elements having a gate terminal, a source terminal, and a drain terminal in the basic structure. TFTs are active elements having a function of switching the current between the source terminal and the drain terminal so that a semiconductor thin film deposited on a substrate is used as a channel layer in which electrons or holes move and a voltage is applied to the gate terminal to control the current flowing in the channel layer. TFTs are electronic devices that are most widely used these days in practical application. Typical applications of TFTs include liquid-crystal driving elements.

Currently, most widely used TFTs are metal-insulator-semiconductor-FETs (MIS-FETs) in which a polycrystalline silicon film or an amorphous silicon film is used as a channel layer material. MIS-FETs including silicon are opaque to visible light and thus fail to form transparent circuits. Therefore, when MIS-FETs are used as switching elements for driving liquid crystals in liquid crystal displays, the aperture ratio of a display pixel in the devices is small.

Due to the recent need for high-resolution liquid crystals, switching elements for driving liquid crystals now require high-speed driving. In order to achieve high-speed driving, a semiconductor thin film in which the mobility of electrons or holes as carriers, is higher than that in at least amorphous silicon needs to be used as a channel layer.

Under such circumstances, Patent Document 1 proposes a transparent semi-insulating amorphous oxide thin film which is a transparent amorphous oxide thin film deposited by vapor deposition and containing elements of In, Ga, Zn, and O. The composition of the oxide is $InGaO_3(ZnO)_m$ (m is a natural number less than 6) when the oxide is crystallized. The transparent semi-insulating amorphous oxide thin film is a semi-insulating thin film having a carrier mobility (also referred to as carrier electron mobility) of more than 1 $cm^2 V^{-1} sec^{-1}$ and a carrier density (also referred to as carrier electron density) of $10^{16} cm^{-3}$ or less without doping with an impurity ion.

However, as proposed in Patent Document 1, it is pointed out that the transparent amorphous oxide thin film (a-IGZO film) containing elements of In, Ga, Zn, and O and deposited by any method of vapor deposition selected from sputtering and pulsed laser deposition has a carrier mobility in a range of about 1 $cm^2 V^{-1} sec^{-1}$ or more to 10 $cm^2 V^{-1} sec^{-1}$ or less, and carrier mobility with respect to higher resolution of a device is not sufficient.

Patent Document 2 discloses a sputtering target for forming the amorphous oxide thin film described in Patent Document 1, that is, a sputtering target that is a sintered body target containing at least In, Zn, and Ga. The composition thereof contains In, Zn, and Ga, the relative density is 75% or more, and the resistance value ρ is 50 Ω cm or less. However, since the target of Patent Document 2 is a polycrystalline oxide sintered body having a homologous phase crystal structure, the amorphous oxide thin film obtained from the polycrystalline oxide sintered body has a carrier mobility of only about 10 $cm^2 V^{-1} sec^{-1}$, similarly to Patent Document 1.

Regarding materials for realizing high carrier mobility, Patent Document 3 proposes a thin film transistor including an oxide thin film in which gallium is dissolved in indium oxide. In the oxide thin film, the Ga/(Ga+In) atomic ratio is 0.001 or more and 0.12 or less, and the percentage of indium and gallium with respect to the total metal atoms is 80 at % or more. The oxide thin film has an $In_2O_3$ bixbyite structure. An oxide sintered body is proposed as the material of the oxide thin film in which gallium is dissolved in indium oxide. In the oxide sintered body, the Ga/(Ga+In) atomic ratio is 0.001 or more and 0.12 or less, and the percentage of indium and gallium with respect to the total metal atoms is 80 at % or more. The oxide sintered body has an $In_2O_3$ bixbyite structure.

However, when the crystalline oxide semiconductor thin film as proposed in Patent Document 3 is applied to TFTs, a problem arises in the variation of TFT characteristics caused by the crystal grain boundary. In particular, it is extremely difficult to uniformly form a TFT on a large-sized glass substrate of the eighth generation or later.

Patent Document 4 describes an oxide sintered body having a bixbyite structure and containing indium oxide, gallium oxide, and positive trivalent and/or positive tetravalent metal. In the sintered body, the content of positive trivalent and/or positive tetravalent metal is 100 ppm or more and 10,000 ppm or less and the composition amount of indium (In) and gallium (Ga) is in the composition range satisfying the formula: 0.005<In/(In+Ga)<0.15 in atomic percent. In the TFT evaluation, Example having high mobility of about 60 $cm^2 V^{-1} sec^{-1}$ is disclosed.

However, an oxide semiconductor thin film obtained by the sintered body of Patent Document 4 has a problem in that microcrystals or the like are likely to be generated, and particularly, it is difficult to form a TFT having a favorable yield ratio on a large-sized glass substrate. In the production process of a thin film transistor of an oxide semiconductor, generally, an amorphous film is formed once and then an amorphous or crystalline oxide semiconductor thin film is obtained by subjecting the amorphous film to an annealing treatment. Wet etching with weak acid of an aqueous solution or the like containing oxalic acid, hydrochloric acid, or the like is carried out in order to perform the patterning processing to create a desired channel layer after the amorphous film forming process. However, when an oxide sintered body substantially composed of only a bixbyite structure of Patent Document 4 is used, the crystallization temperature of the amorphous film to be formed is decreased. Thus, a problem arises in that microcrystals are already generated at the subsequent stage after the film deposition to generate residues in the etching process or crystallization partially proceeds so that etching cannot be performed. That is, a problem arises in that the desired TFT channel layer is difficult to pattern and form by a wet etching method using a photolithographic technique or the like, or even if a TFT can be formed, the TFT is not stably operated.

Patent Document 1: Japanese Unexamined Patent Application, Publication No. 2010-219538
Patent Document 2: Japanese Unexamined Patent Application, Publication No. 2007-073312
Patent Document 3: PCT International Publication No. WO2010/032422
Patent Document 4: PCT International Publication No. WO2011/152048

DISCLOSURE OF THE INVENTION

Problems to be Solved by the Invention

An object of the present invention is to provide a sputtering target that allows an amorphous oxide semiconductor thin film having a favorable wet etching property and high carrier mobility to be formed, an oxide sintered body most suitable for obtaining the sputtering target, and an oxide semiconductor thin film that is obtained by using the sputtering target and has low carrier density and high carrier mobility.

Means for Solving the Problems

The present inventors have newly found out that when an oxide sintered body containing indium, gallium, and aluminum as oxides and having a gallium content of 0.15 or more and 0.49 or less in terms of the Ga/(In+Ga) atomic ratio and an aluminum content of 0.0001 or more and less than 0.25 in terms of the Al/(In+Ga+Al) atomic ratio includes an $In_2O_3$ phase having a bixbyite-type structure, and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure, a $(Ga, In)_2O_3$ phase, and an $InAlO_3$ phase as a formed phase other than the $In_2O_3$ phase, an amorphous oxide semiconductor thin film produced by using the oxide sintered body has favorable wet etching property, low carrier density, and high carrier mobility.

That is, in a first embodiment of the present invention, an oxide sintered body contains indium, gallium, and aluminum as oxides. The content of the gallium is 0.15 or more and 0.49 or less in terms of Ga/(In+Ga) atomic ratio, and the content of the aluminum is 0.0001 or more and less than 0.25 in terms of Al/(In+Ga+Al) atomic ratio.

In a second embodiment of the present invention, the oxide sintered body according to the first embodiment includes an $In_2O_3$ phase having a bixbyite-type structure, and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure and a $(Ga, In)_2O_3$ phase as a formed phase other than the $In_2O_3$ phase.

In a third embodiment of the present invention, the content of the aluminum is 0.01 or more and 0.20 or less in terms of Al/(In+Ga+Al) atomic ratio in the oxide sintered body according to the first or second embodiment.

In a fourth embodiment of the present invention, the content of the gallium is 0.20 or more and 0.45 or less in terms of Ga/(In+Ga) atomic ratio in the oxide sintered body according to any one of the first to third embodiments.

In a fifth embodiment of the present invention, a sputtering target is obtained by machining the oxide sintered body according to any one of the first to fourth embodiments.

In a sixth embodiment of the present invention, an amorphous oxide semiconductor thin film is formed on a substrate by a sputtering method using the sputtering target according to the fifth embodiment and then subjected to a heat treatment in an oxidizing atmosphere.

In a seventh embodiment of the present invention, the oxide semiconductor thin film according to the sixth embodiment has a carrier density of less than $4.0\times10^{18}$ $cm^{-3}$ and a carrier mobility of 10 $cm^2$ $V^{-1}$ $sec^{-1}$ or more.

In an eighth embodiment of the present invention, the oxide semiconductor thin film according to the seventh embodiment has a carrier density of $6.0\times10^{17}$ $cm^{-3}$ or less.

In a ninth embodiment of the present invention, the oxide semiconductor thin film according to the seventh or eighth embodiment has a carrier mobility of 15 $cm^2$ $V^{-1}$ $sec^{-1}$ or more.

Effects of the Invention

When the oxide sintered body of the present invention containing indium, gallium, and aluminum as oxides, having a gallium content of 0.15 or more and 0.49 or less in terms of the Ga/(In+Ga) atomic ratio and an aluminum content of 0.0001 or more and less than 0.25 in terms of Al/(In+Ga+Al) atomic ratio, and including an $In_2O_3$ phase having a bixbyite-type structure, and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure and a $(Ga, In)_2O_3$ phase as a formed phase other than the $In_2O_3$ phase is used, for example, as a sputtering target, the amorphous oxide semiconductor thin film of the present invention can be obtained by sputter deposition and then subjecting the thin film to a heat treatment. The thin film formed by sputter deposition has an effect obtained by containing a predetermined amount of gallium and aluminum so that microcrystals or the like are not generated and the thin film has sufficient amorphous properties. Thus, the thin film can be subjected to patterning processing in a desired shape by wet etching. By the same effect, the amorphous oxide semiconductor thin film of the present invention has low carrier density and high carrier mobility. Thus, when the amorphous oxide semiconductor thin film of the present invention is applied to TFTs, the on/off ratio of TFTs can be increased. Therefore, the oxide sintered body, the target, and the oxide semiconductor thin film obtained by using the target of the present invention are industrially very useful.

PREFERRED MODE FOR CARRYING OUT THE INVENTION

Figure 1:
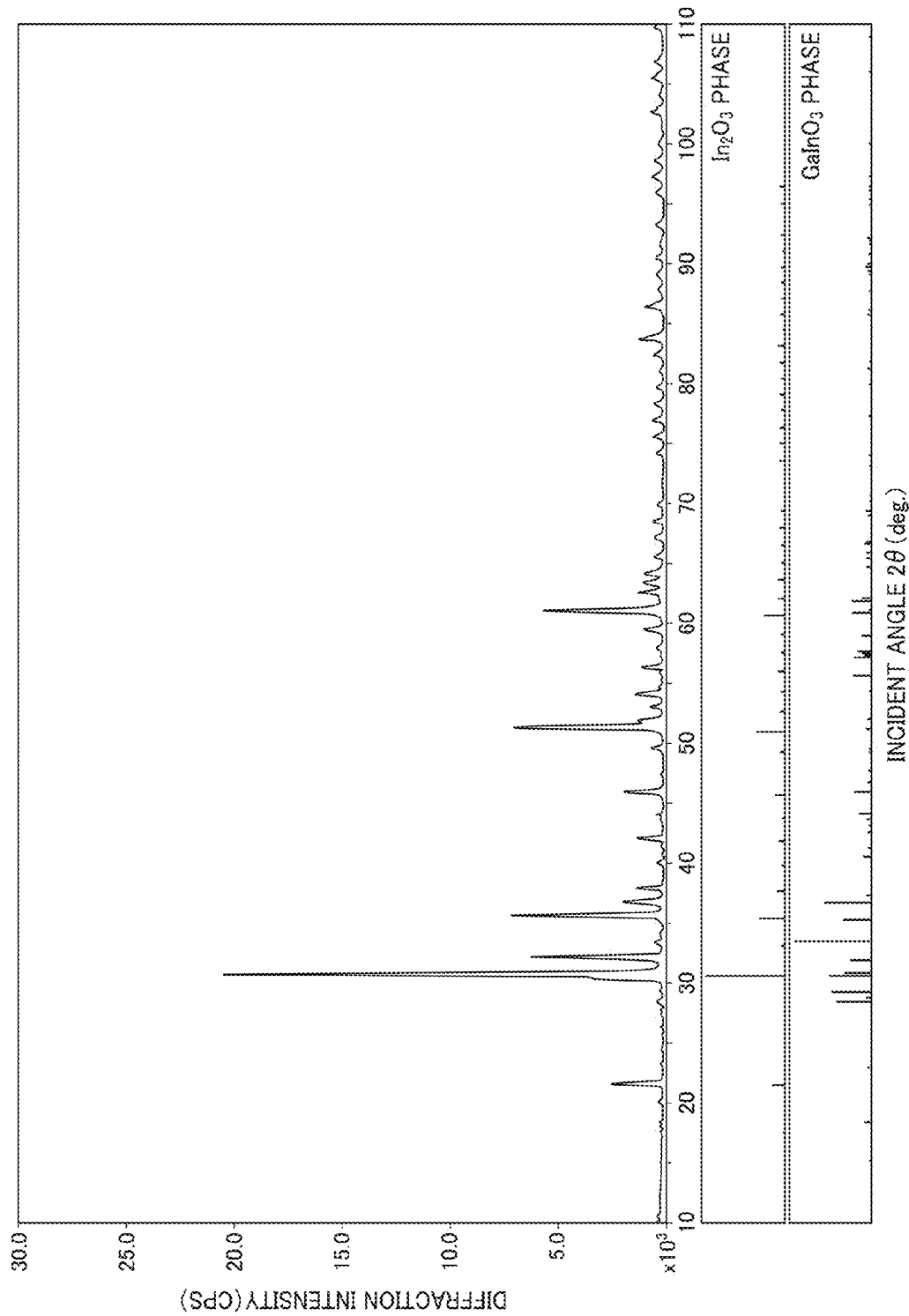
FIG. 1 is a graph showing an X-ray diffraction measurement spectrum of an oxide sintered body of Example 6.

An oxide sintered body, a sputtering target, and an oxide semiconductor thin film obtained by using the target in the present invention will be described below in detail.

(1) Oxide Sintered Body
(a) Composition

The oxide sintered body of the present invention is an oxide sintered body containing indium, gallium, and aluminum as oxides. A gallium content is 0.15 or more and 0.49 or less in terms of Ga/(In+Ga) atomic ratio, and an aluminum content is 0.0001 or more and less than 0.25 in terms of Al/(In+Ga+Al) atomic ratio.

The gallium content, in terms of Ga/(In+Ga) atomic ratio, is 0.15 or more and 0.49 or less and preferably 0.20 or more and 0.45 or less. Gallium has the effect of increasing the crystallization temperature of the amorphous oxide semiconductor thin film of the present invention. Further, gallium has high bonding strength to oxygen and has the effect of reducing the oxygen loss in the amorphous oxide semiconductor thin film of the present invention. When the gallium content is less than 0.15 in terms of Ga/(In+Ga) atomic ratio, these effects are not sufficiently obtained. On the other hand, when the gallium content is more than 0.49, the carrier mobility is not high enough for an oxide semiconductor thin film.

The oxide sintered body of the present invention contains aluminum in addition to indium and gallium in the composition ranges defined above. The concentration of aluminum, in terms of Al/(In+Ga+Al) atomic ratio, is 0.0001 or more and less than 0.25 and preferably 0.01 or more and 0.20 or less. Aluminum has the effect of increasing the crystallization temperature of the amorphous oxide semiconductor thin film of the present invention. Further, doping the oxide sintered body with aluminum suppresses the carrier density of the amorphous oxide semiconductor thin film of the present invention. However, when the concentration of aluminum is more than 0.25, the bulk resistance value of the sputtering target increases. Thus, a homogeneous film cannot be obtained due to abnormal discharge such as arc discharge (arcing) at the time of deposition when sputtering is performed.

According to the effect, when the amorphous oxide semiconductor thin film of the present invention is applied to TFTs, the on/off ratio of TFTs can be increased.

(b) Structure of Sintered Body

The oxide sintered body of the present invention includes an $In_2O_3$ phase having a bixbyite-type structure and a $GaInO_3$ phase having a $\beta$-$Ga_2O_3$-type structure, and may contain a $(Ga, In)_2O_3$ phase to a certain extent in addition thereto.

Herein, gallium is preferably dissolved in the $In_2O_3$ phase or preferably makes up the $GaInO_3$ phase. In the case of being dissolved in the $In_2O_3$ phase, gallium, which is basically a trivalent cation, substitutes for indium, which similarly is a trivalent cation, at the lattice position. In the case of making up the $GaInO_3$ phase and the $(Ga, In)_2O_3$ phase, basically, Ga occupies the original lattice position, but may be slightly dissolved to substitute at the lattice position of In as a defect. Further, it is not preferred that gallium is difficult to dissolve in the $In_2O_3$ phase, or the $GaInO_3$ phase having a $\beta$-$Ga_2O_3$-type structure and the $(Ga, In)_2O_3$ phase are difficult to generate, and as a result, the $Ga_2O_3$ phase having a $\beta$-$Ga_2O_3$-type structure is formed because of unsuccessful sintering or the like. Since the $Ga_2O_3$ phase has low conductivity, abnormal discharge arises.

Aluminum is preferably dissolved in the $In_2O_3$ phase or the $GaInO_3$ phase. In the case of being dissolved in the $In_2O_3$ phase, aluminum, which is basically a trivalent cation, substitutes for indium, which is similarly a trivalent cation, at the lattice position. In the case of being dissolved in the $GaInO_3$ phase and the $(Ga, In)_2O_3$ phase, basically, In or Ga substitutes at the lattice position.

The oxide sintered body may be composed of at least an $In_2O_3$ phase, and contain a $GaInO_3$ phase having a $\beta$-$Ga_2O_3$-type structure and a $(Ga, In)_2O_3$ phase. Crystal grains of these phases preferably have a mean particle size of 5 μm or less. Crystal grains of these phases are difficult to subject to sputtering as compared to the crystal grains of the $In_2O_3$ phase having a bixbyite-type structure so that they remain and generate nodules, and thus the nodules may cause arcing.

(2) Method for Producing Oxide Sintered Body

The oxide sintered body of the present invention is produced by using an oxide powder consisting of an indium oxide powder and a gallium oxide powder, and an aluminum oxide powder as raw material powders.

In the process for producing the oxide sintered body of the present invention, these raw material powders are mixed and then compacted, and the compact is sintered by ordinary-pressure sintering. The formed phases in the structure of the oxide sintered body of the present invention strongly depend on the conditions in each step for producing the oxide sintered body, for example, the particle size of the raw material powders, the mixing conditions, and the sintering conditions.

The structure of the oxide sintered body of the present invention is preferably controlled so that each crystal grain of the $InAlO_3$ phase, the $GaInO_3$ phase having a $\beta$-$Ga_2O_3$-type structure, and the $(Ga, In)_2O_3$ phase is 5.0 μm or less. For this reason, the mean particle size of the raw material powder is adjusted to more preferably 3.0 μm or less and even more preferably 1.0 μm or less.

Indium oxide powder is a raw material for ITO (tin-doped indium oxide), and fine indium oxide powder having good sintering properties has been developed along with improvements in ITO. Since indium oxide powder has been continuously used in large quantities as a raw material for ITO, a raw material powder having a mean particle size of 1.0 μm or less is available these days.

Since aluminum oxide (alumina) powder is widely used as a raw material for ceramics or sapphire, raw material powder having a mean particle size of 1.0 μm or less is available.

However, since the amount of gallium oxide powder used is still smaller than that of indium oxide powder used, it is difficult to obtain raw material powder having a mean particle size of 1.0 μm or less. When only coarse gallium oxide powder is available, the powder needs to be pulverized into particles having a mean particle size of 1.0 μm or less.

In the process for sintering the oxide sintered body of the present invention, ordinary-pressure sintering is preferably employed. Ordinary-pressure sintering is a simple and industrially advantageous method, and is also an economically preferable means.

When ordinary-pressure sintering is used, a compact is first produced as described above. Raw material powders are placed in a resin pot and mixed with a binder (for example, PVA) and the like by wet ball milling or the like. The oxide sintered body of the present invention may be composed of the $InAlO_3$ phase, the $In_2O_3$ phase having a bixbyite-type structure, and the $GaInO_3$ phase having a $\beta$-$Ga_2O_3$-type structure, and may further include the $(Ga, In)_2O_3$ phase. The crystal grains of these phases are preferably controlled to have a mean particle size of 5 μm or less and to be finely dispersed. It is preferable to suppress formation of the $(Ga, In)_2O_3$ phase as much as possible. In addition, it is necessary that the $Ga_2O_3$ phase having a $\beta$-$Ga_2O_3$-type structure, which causes arcing, other than these phases is not generated. The ball mill mixing is preferably performed for 18 hours or longer in order to satisfy these requirements. At this time, hard $ZrO_2$ balls may be used as mixing balls. After mixing, the slurry is taken out, filtered, dried, and granulated. Subsequently, the resultant granulated material is compacted under a pressure of about 9.8 MPa (0.1 ton/cm$^{2)}$ or more and 294 MPa (3 ton/cm$^2$) or less by cold isostatic pressing to form a compact.

The sintering process by ordinary-pressure sintering is preferably preformed in an atmosphere containing oxygen. The volume fraction of oxygen in the atmosphere is preferably over 20%. In particular, when the volume fraction of oxygen is over 20%, the oxide sintered body is further densified. n excessive amount of oxygen in the atmosphere causes the surface of the compact to undergo sintering in advance during the early stage of sintering. Subsequently, sintering proceeds while the inside of the compact is reduced, and a highly dense oxide sintered body is finally obtained.

In an atmosphere free of oxygen, the surface of the compact does not undergo sintering and as a result, densification of the sintered body does not proceed. If oxygen is absent, indium oxide decomposes particularly at about 900° C. to 1000° C. to form metal indium, which makes it difficult to obtain a desired oxide sintered body.

The temperature range of ordinary-pressure sintering is preferably 1200° C. or higher and 1550° C. or lower and more preferably 1350° C. or higher and 1450° C. or lower in an atmosphere obtained by introducing oxygen gas into air in a sintering furnace. The sintering time is preferably 10 hours or longer and 30 hours or shorter, and more preferably 15 hours or longer and 25 hours or shorter.

When the sintering temperature is adjusted in the above range and the oxide powder consisting of an indium oxide powder and a gallium oxide powder and the aluminum oxide powder which are controlled to have a mean particle size of 1.0 μm or less are used as raw material powders, the oxide sintered body is mainly composed of the $In_2O_3$ phase having a bixbyite-type structure and the $GaInO_3$ phase having a β-$Ga_2O_3$-type structure or the $(Ga, In)_2O_3$ phase.

At a sintering temperature lower than 1200° C., the sintering reaction does not proceed well. On the other hand, densification increase with more difficulty at a sintering temperature higher than 1550° C., and the components of the sintering furnace and the oxide sintered body react with each other, which makes it difficult to obtain a desired oxide sintered body. In particular, since the gallium content in the oxide sintered body of the present invention is 0.15 or more in terms of Ga/(In+Ga) atomic ratio, the sintering temperature is preferably set to 1450° C. or lower. This is because formation of the $(Ga, In)_2O_3$ phase is significant in the temperature range around 1500° C. in some cases. There is no problem as long as the amount of the $(Ga, In)_2O_3$ phase is small, but when the amount thereof is large, a decrease in deposition rate and arcing may occur, which is not preferable.

The temperature elevation rate until the sintering temperature is reached is preferably in the range of 0.2° C. to 5° C./min in order to cause debinding without forming cracks in the sintered body. As long as the temperature elevation rate is this range, the temperature may be increased to the sintering temperature in a combination of different temperature elevation rates as desired. During the temperature elevation process, a particular temperature may be maintained for a certain time in order for debinding and sintering to proceed. After sintering, oxygen introduction is stopped before cooling. The temperature is preferably decreased to 1000° C. at a temperature drop rate in the range of preferably 0.2 to 5° C./min, and particularly 0.2° C./min or more and less than 1° C./min.

(3) Target

The target of the present invention can be obtained by machining the oxide sintered body of the present invention to a predetermined size. When the oxide sintered body is used as the target, the target can be obtained by further grinding the surface thereof and bonding the oxide sintered body to a backing plate. The target preferably has a flat shape, but may have a cylindrical shape. When a cylindrical target is used, it is preferred to suppress particle generation due to target rotation. In addition, the oxide sintered body is machined, for example, into a circular cylindrical shape to form a tablet, and the tablet can be used for film deposition by a vapor-deposition method or an ion plating method.

For use as a sputtering target, the density of the oxide sintered body of the present invention is preferably 6.3 g/cm$^3$ or more and more preferably 6.7 g/cm$^3$ or more. When the density is less than 6.3 g/cm$^3$, nodules are formed during use in mass production. For use as a tablet for ion plating, the density of the oxide sintered body is preferably less than 6.3 g/cm$^3$ and more preferably 3.4 g/cm$^3$ or more and 5.5 g/cm$^3$ or less. In this case, the sintering temperature is preferably lower than 1200° C.

(4) Oxide Semiconductor Thin Film and Method for Depositing Oxide Semiconductor Thin Film The amorphous oxide semiconductor thin film of the present invention is mainly obtained as follows: first forming an amorphous oxide thin film on a substrate by a sputtering method using the sputtering target; and then subjecting the amorphous oxide thin film to an annealing treatment.

The sputtering target is formed from the oxide sintered body of the present invention. The structure of the oxide sintered body, that is, the structure composed basically of an $In_2O_3$ phase having a bixbyite-type structure and a $GaInO_3$ phase having a β-$Ga_2O_3$-type structure or a $GaInO_3$ phase having a β-$Ga_2O_3$-type structure and a $(Ga, In)_2O_3$ phase, is important. In order to obtain the amorphous oxide semiconductor thin film of the present invention, it is important that the crystallization temperature of the amorphous oxide semiconductor thin film is high. This is related to the structure of the oxide sintered body. That is, when the oxide sintered body includes not only an $In_2O_3$ phase having a bixbyite-type structure but also a $GaInO_3$ phase having a β-$Ga_2O_3$-type structure or a $GaInO_3$ phase having a β-$Ga_2O_3$-type structure and a $(Ga, In)_2O_3$ phase as in the oxide sintered body of the present invention, the oxide thin film obtained from this oxide sintered body has a high crystallization temperature, namely, a crystallization temperature of 300° C. or higher, more preferably 350° C. or higher, and is a stable amorphous film. In contrast, when the oxide sintered body includes only an $In_2O_3$ phase having a bixbyite-type structure, the oxide thin film obtained from this oxide sintered body has a low crystallization temperature of about 200° C. and is not amorphous. Incidentally, in this case, microcrystals are already generated after the film deposition so that the amorphous properties are not maintained. Thus, it is difficult to perform patterning by wet etching.

In the film deposition process of the amorphous oxide semiconductor thin film of the present invention, a general sputtering method is used. In particular, according to a direct current (DC) sputtering method, thermal influence in film deposition is small, and high rate film deposition is possible, which is thus industrially advantageous. To form the oxide semiconductor thin film of the present invention by the direct current sputtering method, a gas mixture of inert gas and oxygen, particularly argon and oxygen, is preferably used as the sputtering gas. Sputtering is preferably performed in a chamber of a sputtering apparatus at an internal pressure of 0.1 Pa or more and 1 Pa or less, particularly, 0.2 Pa or more and 0.8 Pa or less.

The substrate is typically a glass substrate and is preferably an alkali-free glass. In addition, any resin sheet and resin film that withstands the above process condition can be used.

In the process for forming the amorphous oxide thin film, presputtering can be performed as follows: for example, after evacuation to $2 \times 10^{-4}$ Pa or less, introducing a gas mixture of argon and oxygen until the gas pressure reaches 0.2 Pa or more and 0.8 Pa or less; and generating a direct current plasma by applying direct current power so that the direct current power with respect to the area of the target, namely, the direct current power density, is in the range of about 1 W/cm$^2$ or more and 7 W/cm$^2$ or less. It is preferred that, after this presputtering for 5 minutes or longer and 30 minutes or shorter, the substrate position be corrected as desired and then sputtering be performed.

In sputter deposition in the film deposition process, the direct current power applied is increased in order to increase the deposition rate.

The amorphous oxide semiconductor thin film of the present invention is obtained by forming the amorphous oxide thin film and then performing an annealing treatment on the amorphous oxide thin film. As a method until the annealing treatment, for example, an amorphous oxide thin film is first formed at a low temperature, such as at around room temperature, and then an annealing treatment is performed at a temperature lower than the crystallization temperature to obtain an oxide semiconductor thin film while maintaining the amorphous state. As another method, a substrate is heated to a temperature lower than the crystallization temperature, preferably, to 100° C. or higher and 300° C. or lower to form an amorphous oxide semiconductor thin film. Subsequently thereto, an annealing treatment may be further performed. The heating temperature in these two methods is sufficiently about 600° C. or lower and can be set to be equal to or lower than the strain point of an alkali-free glass substrate.

The amorphous oxide semiconductor thin film of the present invention is obtained by first forming an amorphous oxide thin film and then subjecting the amorphous oxide thin film to an annealing treatment. The condition for the annealing treatment is a temperature lower than the crystallization temperature in an oxidizing atmosphere. The oxidizing atmosphere is preferably an atmosphere containing oxygen, ozone, water vapor, or nitrogen oxides. The temperature for annealing is 200° C. or higher and 600° C. or lower and preferably 300° C. or higher and 500° C. or lower. The time for annealing, i.e. the time during which the amorphous thin film is held at the temperature for annealing, is 1 minute or longer and 120 minutes or shorter and preferably 5 minutes or longer and 60 minutes or shorter.

The composition of indium, gallium, and aluminum of the amorphous oxide thin film and the amorphous oxide semiconductor thin film substantially corresponds to the composition of the oxide sintered body of the present invention. That is, the amorphous oxide semiconductor thin film contains indium and gallium as oxides and further contains aluminum. The gallium content is 0.15 or more and 0.49 or less in terms of Ga/(In+Ga) atomic ratio and the aluminum content is 0.0001 or more and less than 0.25 in terms of Al/(In+Ga+Al) atomic ratio.

The amorphous oxide semiconductor thin film of the present invention has a reduced carrier density of $4.0 \times 10^{18}$ cm$^{-3}$ or less and a carrier mobility of 10 cm$^2$ V$^{-1}$ sec$^{-1}$ or more when the oxide sintered body with the controlled composition and structure as described above is deposited by using a sputtering target or the like and the annealing treatment is performed thereon under the appropriate conditions. The amorphous oxide semiconductor thin film more preferably with a carrier mobility of 15 cm$^2$ V$^{-1}$ sec$^{-1}$ or more, particularly preferably with a carrier mobility of 20 cm$^2$ V$^{-1}$ sec$^{-1}$ or more is obtained.

The amorphous oxide semiconductor thin film of the present invention is subjected to micromachining, which is required in applications such as TFTs by wet etching or dry etching. Generally, it is possible to perform micromachining by wet etching after the formation of an amorphous oxide thin film first when a temperature lower than the crystallization temperature, for example, an appropriate substrate temperature in the range of from room temperature to 300° C. is selected. Most weak acids can be used as the etchant, but a weak acid composed mainly of oxalic acid or hydrochloric acid is preferably used. For example, commercial products, such as ITO-06N available from Kanto Chemical Co., Inc., can be used. Dry etching may be selected depending on the configuration of TFT.

Although the thickness of the amorphous oxide semiconductor thin film of the present invention is not limited, the thickness is 10 nm or more and 500 nm or less, preferably 20 nm or more and 300 nm or less, and more preferably 30 nm or more and 100 nm or less. When the thickness is less than 10 nm, favorable semiconductor characteristics are not obtained, and as a result, high carrier mobility is not achieved. On the other hand, when the thickness is more than 500 nm, it is disadvantageous in that a problem associated with productivity arises.

EXAMPLES

A more detailed description is provided below by way of Examples of the present invention, but the present invention is not limited by these Examples.

<Evaluation of Oxide Sintered Body>

The composition of the metal elements in the obtained oxide sintered body was determined by ICP emission spectroscopy. The formed phases were identified by a method using a powder X-ray diffractometer (available from Philips) using rejects of the obtained oxide sintered body. The formed phases were identified by making the obtained oxide sintered body into a thin piece by using a focused ion beam apparatus, and performing observation of crystal grains and electron beam diffraction measurement with a scanning transmission electron microscope (available from Hitachi High-Technologies Corporation). Further, the composition of each crystal grain was determined by energy dispersive X-ray analysis (available from Hitachi High-Technologies Corporation).

<Evaluation of Basic Properties of Oxide Thin Film>

The composition of the obtained oxide thin film was determined by ICP emission spectrometry. The thickness of the oxide thin film was determined with a surface profilometer (available from KLA-Tencor Corporation). The deposition rate was calculated from the film thickness and the film deposition time. The carrier density and mobility of the oxide thin film were determined with a Hall-effect measurement apparatus (available from TOYO Corporation). The formed phases in the film were identified by X-ray diffraction measurement.

(Production of Oxide Sintered Body and Oxide Thin Film)

An indium oxide powder, a gallium oxide powder, and an aluminum oxide powder were prepared as raw material powders so that each powder has a mean particle size of 1.0 µm or less. These raw material powders were prepared so as to obtain the Ga/(In+Ga) atomic ratio and the Al/(In+Ga+Al) atomic ratio of Examples and Comparative Examples shown in Table 1 and Table 3. The raw material powders were placed in a resin pot together with water and mixed by wet ball milling. In this case, hard $ZrO_2$ balls were used, and the mixing time was 18 hours. After mixing, the slurry was taken out, filtered, dried, and granulated. The granulated material was compacted by cold isostatic pressing under a pressure of 3 ton/cm$^2$.

Next, the compact was sintered as described below.

The compact was sintered at a sintering temperature of between 1350 and 1450° C. for 20 hours in an atmosphere obtained by introducing oxygen into air in a sintering furnace at a rate of 5 L/min per 0.1 m$^3$ furnace volume. At this time, the temperature was increased by 1° C./min, oxygen introduction was stopped during cooling after sintering, and the temperature was decreased to 1000° C. by 1° C./min.

The composition of the obtained oxide sintered body was analyzed by ICP emission spectrometry. As a result, it was confirmed that the proportion of the metal elements was substantially the same as the composition prepared at the time of mixing raw material powders in all Examples.

Next, results obtained by performing the phase identification of the oxide sintered body by X-ray diffraction measurement (X-ray diffraction, XRD) and the observation of crystal grains by a scanning transmission electron microscope (STEM) and analyzing the composition of each crystal grain by energy dispersive X-ray spectrometry (EDX) analysis are shown in Table 1.

Figure 2:
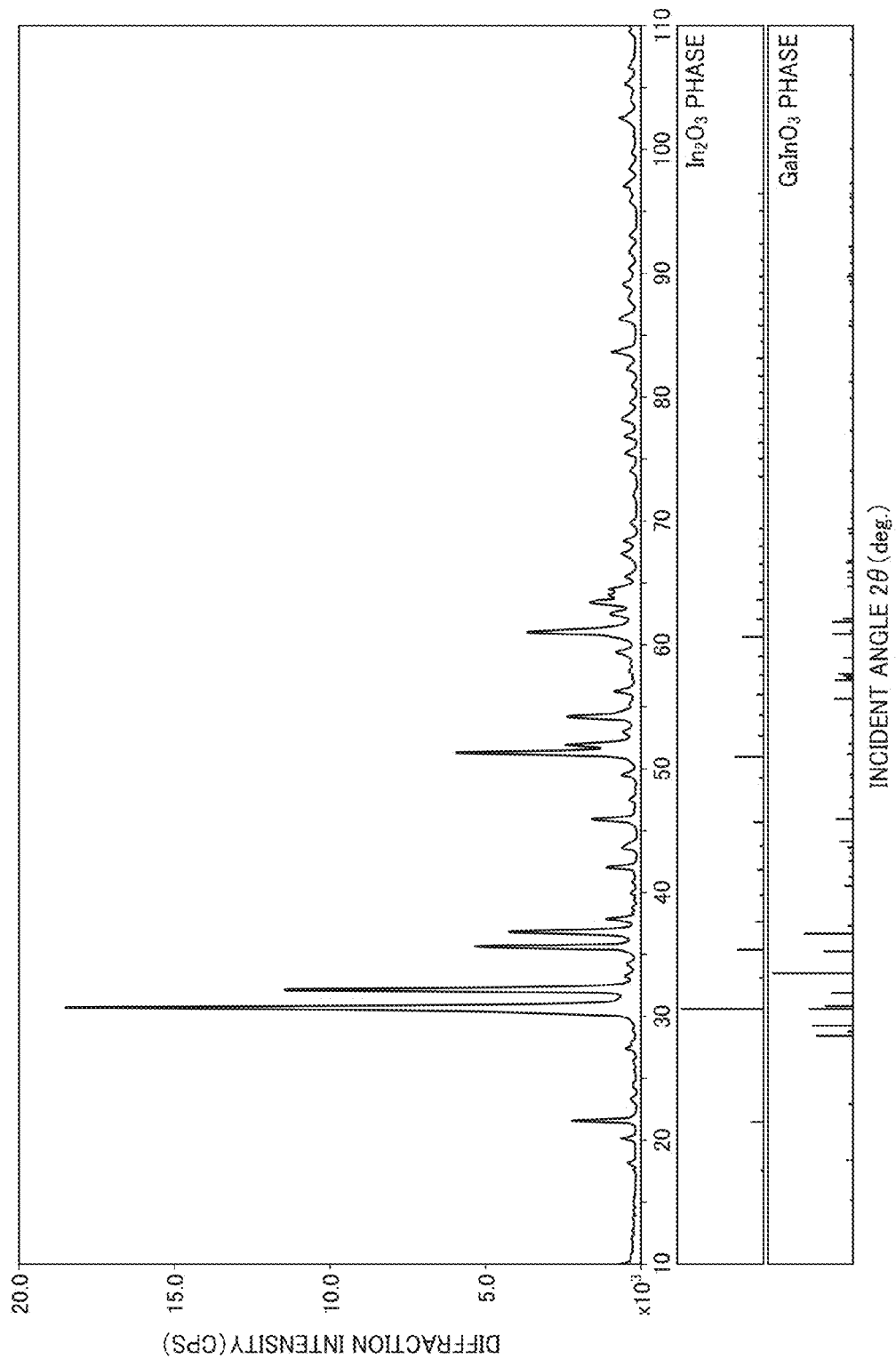
FIG. 2 is a graph showing an X-ray diffraction measurement spectrum of an oxide sintered body of Example 9.
Figure 3:
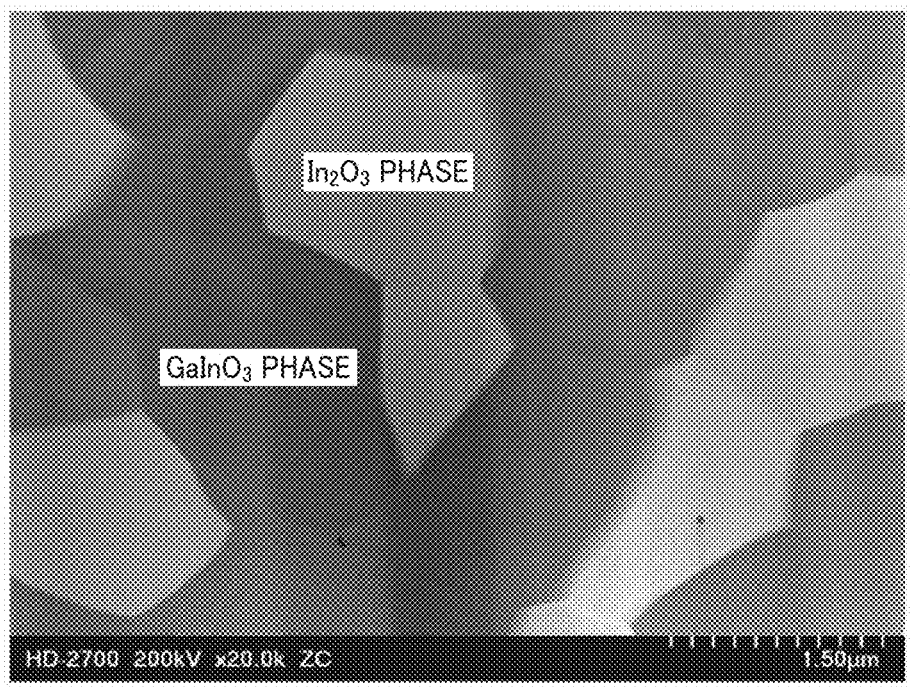
FIG. 3 is a crystal grain photograph of the oxide sintered body of Example 9 captured by using a scanning transmission electron microscope.
Figure 4:
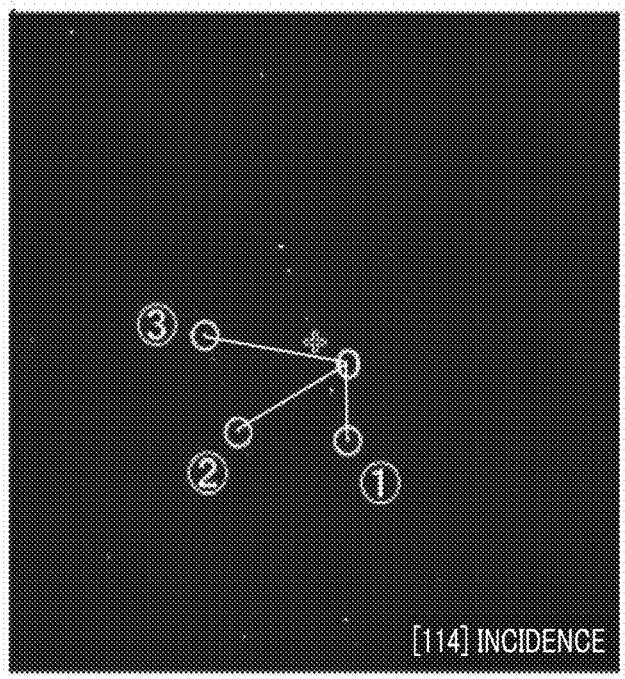
FIG. 4 is an electron beam diffraction photograph of white crystal grains of the oxide sintered body of Example 9 captured by using a scanning transmission electron microscope.
Figure 5:
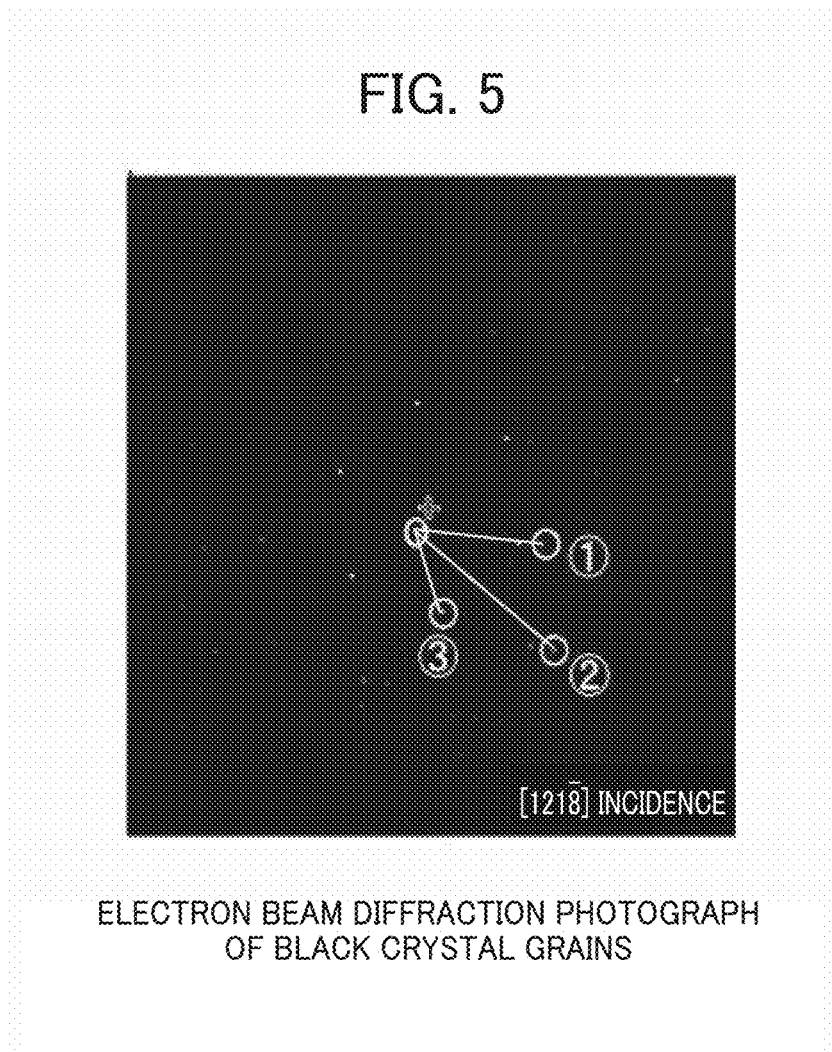
FIG. 5 is an electron beam diffraction photograph of black crystal grains of the oxide sintered body of Example 9 captured by using a scanning transmission electron microscope.

In addition, the results obtained by performing X-ray diffraction measurement and phase identification on Example 6 are shown in FIG. 1, the results obtained by performing X-ray diffraction measurement and phase identification on Example 9 are shown in FIG. 2, and the observation result of Example 9 with a scanning transmission electron microscope is shown in FIG. 3. Through observation with a scanning transmission electron microscope, it was confirmed that there are two types of crystal grains, that is, white crystal grains and black crystal grains. Further, an electron beam diffraction photograph of white crystal grains in FIG. 3 is shown in FIG. 4 and an electron beam diffraction photograph of black crystal grains in FIG. 3 is shown in FIG. 5. Incidentally, in FIGS. 4 and 5, the positions of transparent spots and analyzed diffraction spots are represented by "0" and the transparent spots and the diffraction spots are connected by white lines. The plane distance and the plane angle of each crystal grain are obtained from FIGS. 4 and 5 and results obtained by comparing the plane distance and the plane angle with literature values of a JCPDS card are shown in Table 2. From the comparison with a JCPDS card, it is found that the white crystal grains are $In_2O_3$ phases (JCPDS card number: 00-006-0416) and the black crystal grains are $GaInO_3$ phases (JCPDS card number: 04-017-1567). Further, from the results of X-ray diffraction measurement and energy dispersive X-ray analysis, it is also found that the white crystal grains are $In_2O_3$ phases and the black crystal grains are $GaInO_3$ phases.

The oxide sintered body was machined to a size of 152 mm in diameter and 5 mm in thickness. The sputtering surface was grinded with a cup grinding wheel so that the maximum height Rz was 3.0 µm or less. The machined oxide sintered body was bonded to an oxygen-free copper backing plate by using metal indium to provide a sputtering target.

Film deposition by direct current sputtering was performed at a substrate temperature described in Table 3 by using the sputtering targets of Examples and Comparative Examples and an alkali-free glass substrate (Eagle XG available from Corning). The sputtering target was attached to the cathode of a direct current magnetron sputtering apparatus (available from Tokki Corporation) having a direct current power supply with no arcing control function. At this time, the target-substrate (holder) distance was fixed at 60 mm. After evacuation to $2\times10^{-4}$ Pa or less, a gas mixture of argon and oxygen was introduced at an appropriate oxygen ratio, which depends on the gallium content and the aluminum content in each target. The gas pressure was set to 0.6 Pa. A direct current plasma was generated by applying a direct current power of 300 W (1.64 W/cm$^2$). After presputtering for 10 minutes, the substrate was placed directly above the sputtering target, namely, in the stationary opposing position, and an oxide semiconductor thin film having a thickness of 50 nm was formed. At this time, the presence or absence of the occurrence of arcing was confirmed. The composition of the obtained oxide semiconductor thin film was confirmed to be substantially the same as that of the target.

The deposited oxide semiconductor thin film was subjected to a heat treatment at 300° C. or higher and 500° C. or lower for 30 minutes or longer and 60 minutes or shorter in oxygen as described in Table 3. The crystallinity of the oxide semiconductor thin film after the heat treatment was examined by X-ray diffraction measurement. As a result, the oxide semiconductor thin films of Comparative Examples 1 and 2 were crystallized and the $In_2O_3$ phase having a bixbyite-type structure was generated. However, Examples and Comparative Examples except Comparative Examples 1 and 2 maintained amorphous properties. For crystallized oxide semiconductor thin films, the crystalline phases in the oxide semiconductor thin films were identified. The Hall-effect measurement was performed on the oxide semiconductor thin films of Examples and Comparative Examples except Comparative Examples 1 and 2 to obtain the carrier density and the carrier mobility. The obtained evaluation results are summarized in Table 3.

[Evaluation]

From the results of Table 1, when the gallium content was 0.15 or more and 0.49 or less in terms of Ga/(In+Ga) atomic ratio and the aluminum content was 0.0001 or more and less than 0.25 in terms of Al/(In+Ga+Al) atomic ratio, the oxide sintered bodies of Examples 1 to 17 included an $In_2O_3$ phase having a bixbyite-type structure, and a $GaInO_3$ phase having a $\beta$-$Ga_2O_3$-type structure or a $GaInO_3$ phase having a $\beta$-$Ga_2O_3$-type structure and a $(Ga, In)_2O_3$ phase. On the other hand, in Comparative Examples 1 to 3, the gallium content or aluminum content of the oxide sintered body was smaller than the range of the present invention. For this reason, in Comparative Example 1, the oxide sintered body included only an $In_2O_3$ phase having a bixbyite-type structure. Further, in Comparative Examples 4 to 8, since the aluminum content was excessive, arcing occurs at the time of sputter deposition and a homogeneous film cannot be obtained. Thus, a desired oxide sintered body of the present invention cannot be obtained.

From the results of Table 3, the oxide semiconductor thin film was an amorphous oxide semiconductor thin film containing indium, gallium, and aluminum, in which the gallium content is set to 0.15 or more and 0.49 or less in terms of Ga/(In+Ga) atomic ratio, the aluminum content is controlled to 0.0001 or more and less than 0.25 in terms of Al/(In+Ga+Al) atomic ratio.

It is found that all of the oxide semiconductor thin films of Examples are amorphous. In addition, it is found that the oxide semiconductor thin films of Examples have a carrier density of $4.0\times10^{18}$ cm$^{-3}$ or less and a carrier mobility of 10 cm$^2$ V$^{-1}$ sec$^{-1}$ or more, and particularly, the oxide semiconductor thin films of Examples 6, 7, 9, 11, and 12 in which the gallium content is 0.20 or more and 0.45 or less in terms of Ga/(In+Ga) atomic ratio and the aluminum content is 0.01 or more and 0.20 or less in terms of Al/(In+Ga+Al) atomic ratio have excellent properties in that the carrier density is $6.0\times10^{17}$ cm$^{-3}$ or less and the carrier mobility is 15 cm$^2$ V$^{-1}$ sec$^{-1}$ or more.

On the other hand, in Comparative Examples 1 and 2, the oxide semiconductor thin films after annealing were crystallized and were not amorphous due to the generation of an In$_2$O$_3$ phase having a bixbyite-type structure. It is found that, in Comparative Example 3, the aluminum content in terms of Al/(In+Ga+Al) atomic ratio does not satisfy the range of the present invention, and as a result, the carrier density exceeds $4.0\times10^{18}$ cm$^{-3}$. Regarding the oxide semiconductor thin films of Comparative Examples 4 to 8, as a result of the aluminum content, arcing occurred so that a homogeneous film was not obtained. Thus, the evaluation of carrier density and carrier mobility was not performed on the oxide semiconductor thin films of Comparative Examples 4 to 8. It is found that, since the Ga/(In+Ga) of the oxide semiconductor of Comparative Example 9 exceeds the upper limit, the carrier mobility is less than 10 cm$^2$ V$^{-1}$ sec$^{-1}$.

TABLE 1

| | Ga/(In + Ga) Atomic ratio | Al/(In + Ga + Al) Atomic ratio | Sintering temperature (° C.) | XRD Formed phase | | STEM Type of crystal grain | In$_2$O$_3$ PHASE | | | GaInO$_3$ PHASE | | |
|---|---|---|---|---|---|---|---|---|---|---|---|---|
| | | | | | | | In/(In + Ga + Al) Atomic ratio | Ga/(In + Ga + Al) Atomic ratio | Al/(In + Ga + Al) Atomic ratio | In/(In + Ga + Al) Atomic ratio | Ga/(In + Ga + Al) Atomic ratio | Al/(In + Ga + Al) Atomic ratio |
| Comparative Example 1 | 0.15 | 0 | 1450 | In$_2$O$_3$ | | 1 | Not measured | | | — | — | — |
| Comparative Example 2 | 0.1 | 0.01 | 1400 | In$_2$O$_3$ | GaInO$_3$ | 2 | 0.89 | 0.10 | 0.01 | 0.48 | 0.51 | 0.01 |
| Comparative Example 3 | 0.15 | 0.00005 | 1450 | In$_2$O$_3$ | GaInO$_3$ | 2 | 0.88 | 0.11 | 0.01 | 0.49 | 0.50 | 0.01 |
| Example 1 | 0.15 | 0.0001 | 1400 | In$_2$O$_3$ | GaInO$_3$ | 2 | 0.88 | 0.11 | 0.01 | 0.47 | 0.52 | 0.01 |
| Example 2 | 0.15 | 0.01 | 1400 | In$_2$O$_3$ | GaInO$_3$ | 2 | 0.88 | 0.11 | 0.01 | 0.46 | 0.52 | 0.02 |
| Example 3 | 0.15 | 0.2 | 1400 | In$_2$O$_3$ | GaInO$_3$ | 2 | 0.85 | 0.12 | 0.03 | 0.37 | 0.51 | 0.12 |
| Example 4 | 0.15 | 0.24 | 1400 | In$_2$O$_3$ | GaInO$_3$ | 2 | 0.86 | 0.11 | 0.03 | 0.37 | 0.50 | 0.13 |
| Comparative Example 4 | 0.15 | 0.25 | 1350 | In$_2$O$_3$ | GaInO$_3$ | 2 | 0.86 | 0.11 | 0.03 | 0.36 | 0.30 | 0.14 |
| Example 5 | 0.2 | 0.0001 | 1400 | In$_2$O$_3$ | GaInO$_3$ | 2 | 0.87 | 0.12 | 0.01 | 0.48 | 0.51 | 0.01 |
| Example 6 | 0.2 | 0.01 | 1400 | In$_2$O$_3$ | GaInO$_3$ | 2 | 0.87 | 0.12 | 0.01 | 0.47 | 0.52 | 0.01 |
| Example 7 | 0.2 | 0.2 | 1400 | In$_2$O$_3$ | GaInO$_3$ | 2 | 0.85 | 0.11 | 0.04 | 0.35 | 0.53 | 0.12 |
| Example 8 | 0.2 | 0.24 | 1350 | In$_2$O$_3$ | GaInO$_3$ | 2 | 0.84 | 0.11 | 0.05 | 0.35 | 0.52 | 0.13 |
| Comparative Example 5 | 0.2 | 0.25 | 1350 | In$_2$O$_3$ | GaInO$_3$ | 2 | 0.83 | 0.12 | 0.03 | 0.35 | 0.51 | 0.14 |
| Example 9 | 0.25 | 0.05 | 1400 | In$_2$O$_3$ | GaInO$_3$ | 2 | 0.84 | 0.13 | 0.03 | 0.39 | 0.52 | 0.09 |
| Example 10 | 0.45 | 0.0001 | 1400 | In$_2$O$_3$ | GaInO$_3$ | 2 | 0.85 | 0.14 | 0.01 | 0.48 | 0.51 | 0.01 |
| Example 11 | 0.45 | 0.01 | 1400 | In$_2$O$_3$ | GaInO$_3$ | 2 | 0.85 | 0.14 | 0,01 | 0.47 | 0.52 | 0.01 |
| Example 12 | 0.45 | 0.2 | 1400 | In$_2$O$_3$ | GaInO$_3$ | 2 | 0.85 | 0.14 | 0.01 | 0.35 | 0.53 | 0.12 |
| Example 13 | 0.45 | 0.24 | 1400 | In$_2$O$_3$ | GaInO$_3$ | 2 | 0.82 | 0.14 | 0.04 | 0.33 | 0.54 | 0.13 |
| Comparative Example 6 | 0.45 | 0.25 | 1350 | In$_2$O$_3$ | GaInO$_3$ | 2 | 0.82 | 0.14 | 0.04 | 0.35 | 0.51 | 0.14 |
| Comparative Example 7 | 0.45 | 0.25 | 1350 | In$_2$O$_3$ | GaInO$_3$ | 2 | 0.82 | 0.14 | 0.04 | 0.34 | 0.53 | 0.13 |
| Example 14 | 0.49 | 0.0001 | 1400 | In$_2$O$_3$ | GaInO$_3$ | 2 | 0.85 | 0.14 | 0.01 | 0.46 | 0.53 | 0.01 |
| Example 15 | 0.49 | 0.01 | 1400 | In$_2$O$_3$ | GaInO$_3$ | 2 | 0.85 | 0.14 | 0.01 | 0.43 | 0.54 | 0.01 |
| Example 16 | 0.49 | 0.2 | 1400 | In$_2$O$_3$ | GaInO$_3$ | 2 | 0.83 | 0.14 | 0.03 | 0.45 | 0.52 | 0.03 |
| Example 17 | 0.49 | 0.24 | 1400 | In$_2$O$_3$ | GaInO$_3$ | 2 | 0.83 | 0.14 | 0.03 | 0.36 | 0.51 | 0.13 |
| Comparative Example 8 | 0.5 | 0.25 | 1350 | In$_2$O$_3$ | GaInO$_3$ | 2 | 0.83 | 0.14 | 0.03 | 0.35 | 0.53 | 0.12 |

TABLE 2

| | Plane distance (nm) | | | | | Plane angle (°) | | | |
|---|---|---|---|---|---|---|---|---|---|
| | | | | | JCPDS | | | | JCPDS |
| Measurement place | Plane orientation | | | Measurement value | In$_2$O$_3$ Card number 00-006-0416 | GaInO$_3$ Card number 04-017-1567 | Measurement place | Measurement value | In$_2$O$_3$ Card number 00-006-0416 | GaInO$_3$ Card number 04-017-1567 |
| | h | k | l | | | | | | | |
| White crystal grains 1 | 4 | $\bar{4}$ | 0 | 0.18 | 0.179 | — | Angle formed by 1 and 2 | 63.9 | 64.8 | — |
| 2 | $\bar{2}$ | $\bar{6}$ | 2 | 0.15 | 0.1453 | — | Angle formed by 2 and 3 | 51.1 | 50.5 | — |
| 3 | $\bar{6}$ | $\bar{2}$ | 2 | 0.15 | 0.153 | — | | | | |

TABLE 2-continued

| | | Plane distance (nm) | | | | | Plane angle (°) | | |
|---|---|---|---|---|---|---|---|---|---|
| | | | | JCPDS | | | | JCPDS | |
| | Measurement place | Plane orientation | | | Measurement value | In₂O₃ Card number 00-006-0416 | GaInO₃ Card number 04-017-1567 | Measurement place | Measurement value | In₂O₃ Card number 00-006-0416 | GaInO₃ Card number 04-017-1567 |

| | Measurement place | Plane orientation h k l | Measurement value | In₂O₃ 00-006-0416 | GaInO₃ 04-017-1567 | Measurement place | Measurement value | In₂O₃ 00-006-0416 | GaInO₃ 04-017-1567 |
|---|---|---|---|---|---|---|---|---|---|
| Black crystal grains | 1 | 3 1 3 | 0.14 | — | 0.145 | Angle formed by 1 and 2 | 29.2 | — | 29.6 |
| | 2 | $\bar{2}$ 2 5 | 0.09 | — | 0.096 | Angle formed by 2 and 3 | 36.6 | — | 37.1 |
| | 3 | $\bar{5}$ 1 2 | 0.17 | — | 0.178 | | | | |

TABLE 3

| | Ga/(In + Ga) Atomic ratio | Al/(In + Ga + Al) Atomic ratio | Substrate temperature (° C.) | Heat treatment temperature (° C.) | Film thickness (nm) | Crystal structure of thin film | Carrier density (×10¹⁷ cm⁻³) | Carrier mobility (cm²/V·s) | Arcing occurrence |
|---|---|---|---|---|---|---|---|---|---|
| Comparative Example 1 | 0.15 | 0 | Room temperature | 300 | 50 | In₂O₃ | Not measured | Not measured | No |
| Comparative Example 2 | 0.1 | 0.01 | Room temperature | 300 | 50 | In₂O₃ | Not measured | Not measured | No |
| Comparative Example 3 | 0.15 | 0.00005 | Room temperature | 300 | 50 | Amorphous | 87 | 23.5 | No |
| Example 1 | 0.15 | 0.0001 | Room temperature | 300 | 50 | Amorphous | 13.8 | 21.5 | No |
| Example 2 | 0.15 | 0.01 | Room temperature | 300 | 50 | Amorphous | 7.6 | 18.9 | No |
| Example 3 | 0.15 | 0.2 | Room temperature | 300 | Not measured | Amorphous | 1.0 | 15.2 | No |
| Example 4 | 0.15 | 0.24 | Room temperature | 300 | 50 | Amorphous | 0.8 | 14.2 | No |
| Comparative Example 4 | 0.15 | 0.25 | Room temperature | 300 | 50 | Amorphous | 0.7 | 9.8 | Yes |
| Example 5 | 0.2 | 0.0001 | Room temperature | 350 | 50 | Amorphous | 10.4 | 16.1 | No |
| Example 6 | 0.2 | 0.01 | Room temperature | 350 | 50 | Amorphous | 5.7 | 16.2 | No |
| Example 7 | 0.2 | 0.2 | Room temperature | 350 | 50 | Amorphous | 0.8 | 15.9 | No |
| Example 8 | 0.2 | 0.24 | Room temperature | 350 | 50 | Amorphous | 0.6 | 10.7 | No |
| Comparative Example 5 | 0.2 | 0.25 | Room temperature | 350 | 50 | Amorphous | 0.5 | 7.4 | Yes |
| Example 9 | 0.25 | 0.05 | Room temperature | 400 | 50 | Amorphous | 3.8 | 15.1 | No |
| Example 10 | 0.45 | 0.0001 | Room temperature | 500 | 50 | Amorphous | 0.3 | 11.7 | No |
| Example 11 | 0.45 | 0.01 | Room temperature | 500 | 50 | Amorphous | 0.2 | 15.1 | No |
| Example 12 | 0.45 | 0.2 | Room temperature | 500 | 50 | Amorphous | 0.1 | 15.4 | No |
| Example 13 | 0.45 | 0.24 | Room temperature | 500 | 50 | Amorphous | 0.1 | 10.8 | No |
| Comparative Example 6 | 0.45 | 0.25 | Room temperature | 500 | 50 | Amorphous | 0.1 | 7.9 | Yes |
| Comparative Example 7 | 0.45 | 0.25 | 200 | 400 | 50 | Amorphous | 0.1 | 7.8 | Yes |
| Example 14 | 0.49 | 0.0001 | 200 | 400 | 50 | Amorphous | 0.3 | 11.0 | No |
| Example 15 | 0.49 | 0.01 | 200 | 400 | 50 | Amorphous | 0.2 | 10.5 | No |
| Example 16 | 0.49 | 0.2 | 200 | 400 | 50 | Amorphous | 0.1 | 10.3 | No |
| Example 17 | 0.49 | 0.24 | 200 | 400 | 50 | Amorphous | 0.1 | 10.2 | No |
| Comparative Example 8 | 0.5 | 0.25 | 200 | 400 | 50 | Amorphous | 0.1 | 7.5 | Yes |

The invention claimed is:

1. An oxide sintered body comprising indium, gallium, and aluminum as oxides, wherein
the content of the gallium is 0.15 or more and 0.49 or less in terms of Ga/(In+Ga) atomic ratio, and
the content of the aluminum is 0.0001 or more and less than 0.25 in terms of Al/(In+Ga+Al) atomic ratio,
the oxide sintered body includes an In₂O₃ phase having a bixbyite-type structure, and a GaInO₃ phase having a β-Ga₂O₃-type structure as a formed phase other than the In₂O₃ phase, or a GaInO₃ phase having a β-Ga₂O₃-type structure and a (Ga, In)₂O₃ phase as a formed phase other than the In₂O₃ phase.

2. The oxide sintered body according to claim 1, wherein the content of the aluminum is 0.01 or more and 0.20 or less in terms of Al/(In+Ga+Al) atomic ratio.

3. The oxide sintered body according to claim 1, wherein the content of the gallium is 0.20 or more and 0.45 or less in terms of Ga/(In+Ga) atomic ratio.

4. A sputtering target obtained by machining the oxide sintered body according to claim 1.

* * * * *